United States Patent
Jang et al.

(10) Patent No.: US 10,890,848 B2
(45) Date of Patent: Jan. 12, 2021

(54) MATERIAL FOR DETECTING PHOTORESIST AND METHOD OF FABRICATING SEMICONDUCTOR DEVICE USING THE SAME

(71) Applicant: SAMSUNG ELECTRONICS CO., LTD., Suwon-si (KR)

(72) Inventors: Yoonjung Jang, Pohang-si (KR); Sooyoung Kim, Seongnam-si (KR); Boodeuk Kim, Suwon-si (KR); Soojin Lee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 215 days.

(21) Appl. No.: 16/037,232

(22) Filed: Jul. 17, 2018

(65) Prior Publication Data

US 2019/0187052 A1  Jun. 20, 2019

(30) Foreign Application Priority Data

Dec. 20, 2017 (KR) .................. 10-2017-0176301

(51) Int. Cl.
| | |
|---|---|
| *G03F 7/40* | (2006.01) |
| *G01N 21/64* | (2006.01) |
| *G03F 7/32* | (2006.01) |
| *C08B 37/16* | (2006.01) |
| *G03F 7/16* | (2006.01) |
| *C08L 5/16* | (2006.01) |

(52) U.S. Cl.
CPC ............ *G03F 7/40* (2013.01); *C08B 37/0015* (2013.01); *C08L 5/16* (2013.01); *G01N 21/643* (2013.01); *G03F 7/16* (2013.01); *G03F 7/327* (2013.01); *G01N 2021/6439* (2013.01)

(58) Field of Classification Search
CPC .................................................... G01N 21/643
See application file for complete search history.

(56) References Cited

U.S. PATENT DOCUMENTS

| | | | | |
|---|---|---|---|---|
| 6,091,488 A | * | 7/2000 | Bishop | G01N 21/956 356/237.5 |
| 9,285,359 B2 | | 3/2016 | McKee et al. | |
| 2009/0220381 A1 | * | 9/2009 | McGimpsey | B82Y 30/00 422/68.1 |
| 2015/0044705 A1 | | 2/2015 | McKee et al. | |

FOREIGN PATENT DOCUMENTS

| | | |
|---|---|---|
| JP | 2012-82178 A | 4/2012 |
| JP | 2012-118319 A | 6/2012 |
| JP | 2017-20992 A | 1/2017 |
| KR | 10-1022776 B1 | 3/2011 |
| KR | 10-1234026 B1 | 2/2013 |
| WO | 91/02040 A1 | 2/1991 |
| WO | 91/05605 A1 | 5/1991 |

* cited by examiner

*Primary Examiner* — Kathleen Duda
(74) *Attorney, Agent, or Firm* — Sughrue Mion, PLLC

(57) ABSTRACT

Provided are a material for detecting photoresist and a method for detecting photoresist using the same. The material for detecting photoresist may include a macrocyclic molecule having a hollow structure and a fluorescent substance which is labeled on the macrocyclic molecule, and the macrocyclic molecule is at least one of cyclodexrin, cucurbituril, calixarene, pillararene and catenane.

13 Claims, 9 Drawing Sheets

[Table 1]

| | α-CD | β-CD | γ-CD |
|---|---|---|---|
| Basic structure Formula | | | |
| Three-D structure | | | |
| Inner diameter (Å) | 4.7-5.2 | 6.0-6.4 | 7.5-8.3 |
| Depth (Å) | 6.7 | 7.0 | 7.0 |

FIG. 6

[Table 2]

FIG. 7

[Table 3]

[Table 5]

MATERIAL FOR DETECTING PHOTORESIST AND METHOD OF FABRICATING SEMICONDUCTOR DEVICE USING THE SAME

CROSS-REFERENCE TO THE RELATED APPLICATION

This U.S. non-provisional patent application claims priority under 35 U.S.C. § 119 from Korean Patent Application No. 10-2017-0176301, filed on Dec. 20, 2017, the disclosures of which are incorporated herein in their entireties by reference.

BACKGROUND

Provided are a material for detecting photoresist and a method of fabricating a semiconductor device using the same.

With the increase of the integration degree of semiconductor devices, the wavelength of an exposure light source decreases, and a process is converted into a process using I-line (365 nm), KrF laser (248 nm), or ArF laser (193 nm), and in line with the conversion, the development of various materials is being conducted. Particularly, as the size of a semiconductor device decreases, and patterns which are distorted due to residues or contaminants produced during processes affect the performance, yield and reliability of the semiconductor device, requirements on verifying materials in advance are increasing.

Photoresist is a photosensitive polymer compound, and a photoresist pattern may be formed on a wafer by physical change due to the chemical change of components on exposure and by selective dissolution of an exposed part and an unexposed part during a developing process. In order to manufacture a reliable semiconductor device, inspection after exposure if a photoresist pattern is formed into a desired shape or if photoresist residue are left after removing the photoresist pattern, may be required.

SUMMARY

Provided is a material for detecting photoresist.

In addition, provided is a method of fabricating a semiconductor device with improved reliability.

According to an aspect of an example embodiment to solve the above-described task, a material for detecting photoresist includes a macrocyclic molecule having a hollow structure and a fluorescent substance which is labeled on the macrocyclic molecule, wherein the macrocyclic molecule is at least one of cyclodexrin, cucurbituril, calixarene, pillararene and catenane.

According to an aspect of an example embodiment, a material for detecting photoresist includes a macrocyclic molecule having a hollow structure and a fluorescent substance which is labeled on the macrocyclic molecule, wherein a target molecule on a surface of the photoresist is inserted into the hollow structure, and thus the material for detecting photoresist bonds to the photoresist.

According to an aspect of an example embodiment, a method of fabricating a semiconductor device includes a forming step of forming a photoresist layer including a first part and a second part on a wafer, a removing step of removing the first part and leaving the second part of the photoresist layer, a bonding step of bonding a material for detecting photoresist to a surface of the second part, and an inspecting step of inspecting the second part.

BRIEF DESCRIPTION OF THE DRAWINGS

The accompanying drawings are included to provide a further understanding of the above and/or other aspects, and are incorporated in and constitute a part of this specification. The drawings illustrate example embodiments and, together with the description, serve to explain principles of the example embodiments. In the drawings.

DETAILED DESCRIPTION

Hereinafter, preferred example embodiments will be explained in more detail with reference to the accompanying drawings to particularly explain the example embodiments.

Figure 1:
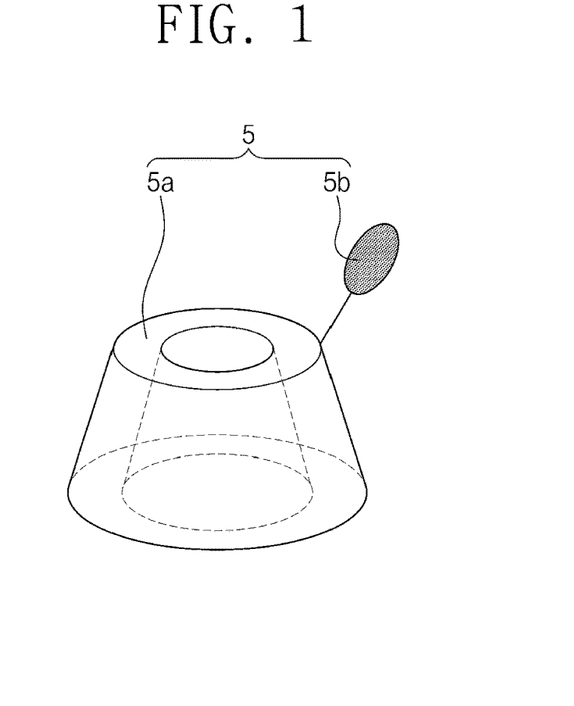
FIG. 1 shows a structure of a material for detecting photoresist according to example embodiments.

FIG. 1 shows a structure of a material for detecting photoresist according to example embodiments.

Referring to FIG. 1, a material 5 for detecting photoresist according to example embodiments may include a macrocyclic molecule 5a having a hollow structure and a fluorescent substance 5b labeled on the macrocyclic molecule 5a. The inner part of the hollow structure of the macrocyclic molecule 5a may be hydrophobic.

The macrocyclic molecule 5a may be, for example, at least one of cyclodextrin (CD), cucurbituril (CB), calixarene, pillararene and catenane.

Figure 5:
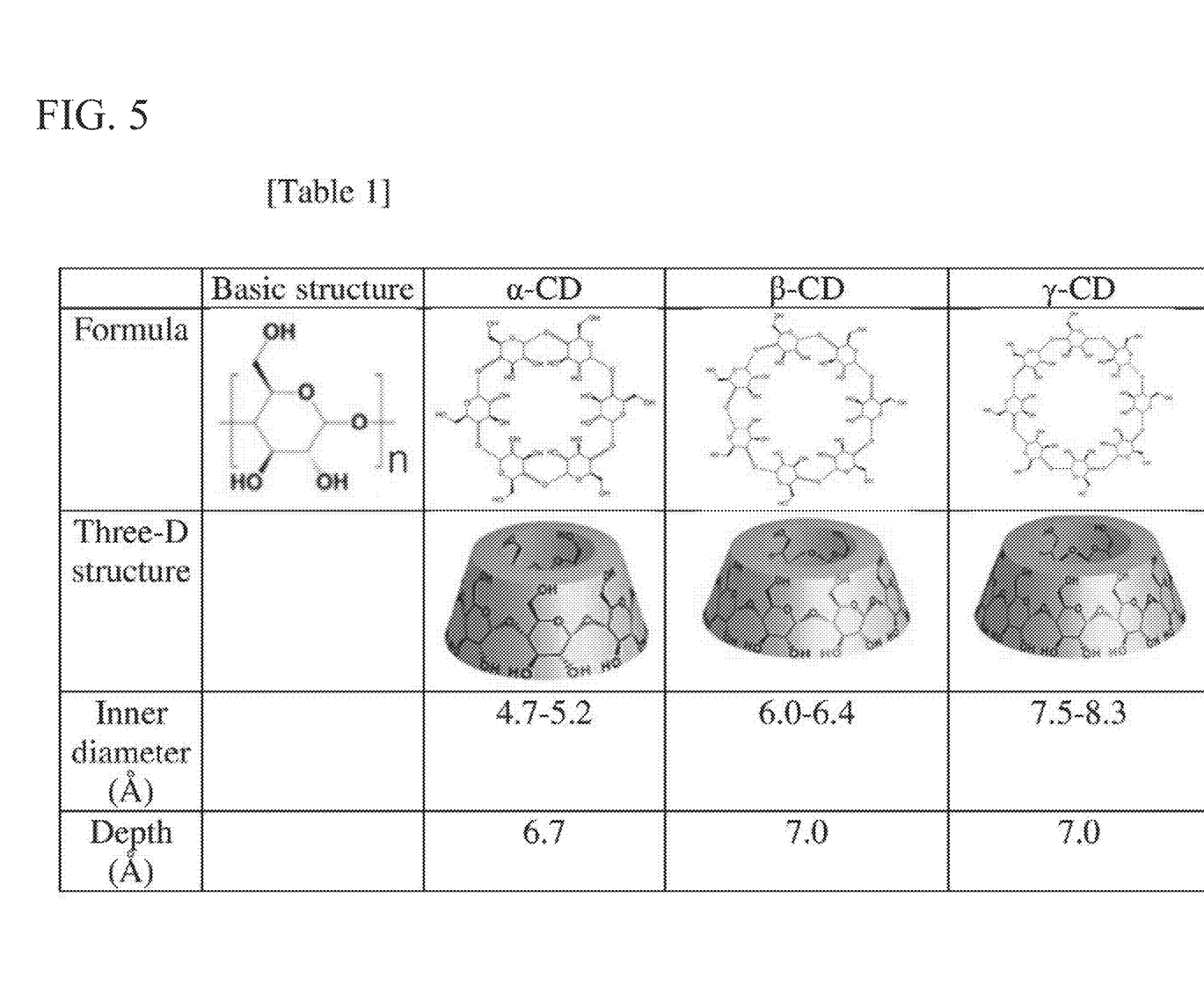
FIG. 5 shows example cyclodextrin (CD) structures.

The cyclodextrin (CD) may have a structure in FIG. 5 (Table 1 therein).

In FIG. 5, the cyclodextrin (CD) may have a structure in which 6-8 glucose molecules, which are repeating units, are bonded (that is, n=6-8). The cyclodextrin including 6 glucose molecules may be named α-CD, the cyclodextrin including 7 glucose molecules may be named β-CD, and the cyclodextrin including 8 glucose molecules may be named γ-CD.

Figure 6:
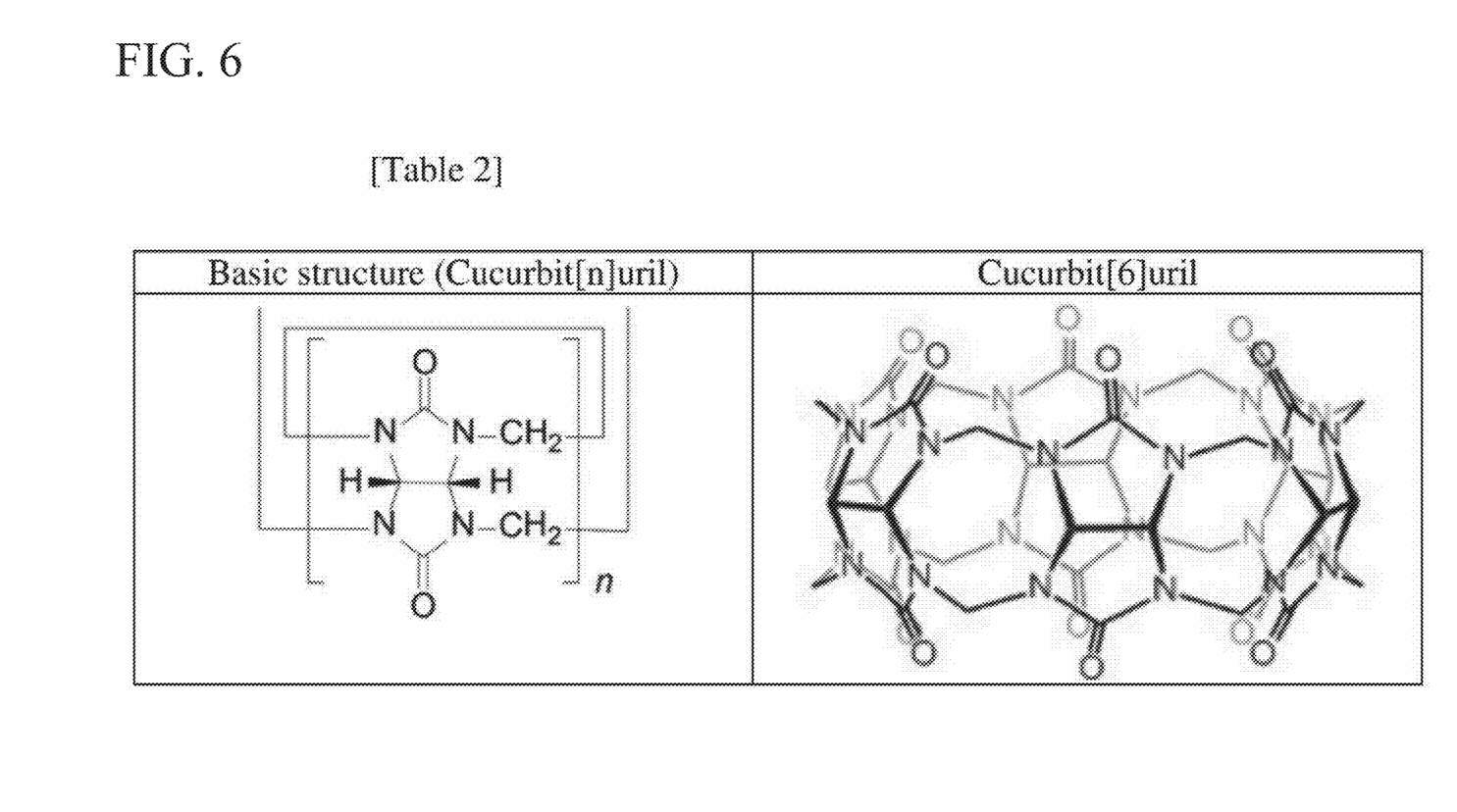
FIG. 6 shows example cucurbituril (CB) structures.

The cucurbituril (CB) may have a structure in FIG. 6 (Table 2 therein).

In FIG. 6, the cucurbituril (CB) includes a repeating unit including glycoluril and may have a structure in which 5-12 repeating units are bonded (that is, n=5-12). For example, if n is 6, the compound may be named as cucurbit[6]uril. The cucurbituril (CB) may have a hollow three-dimensional structure.

Figure 7:
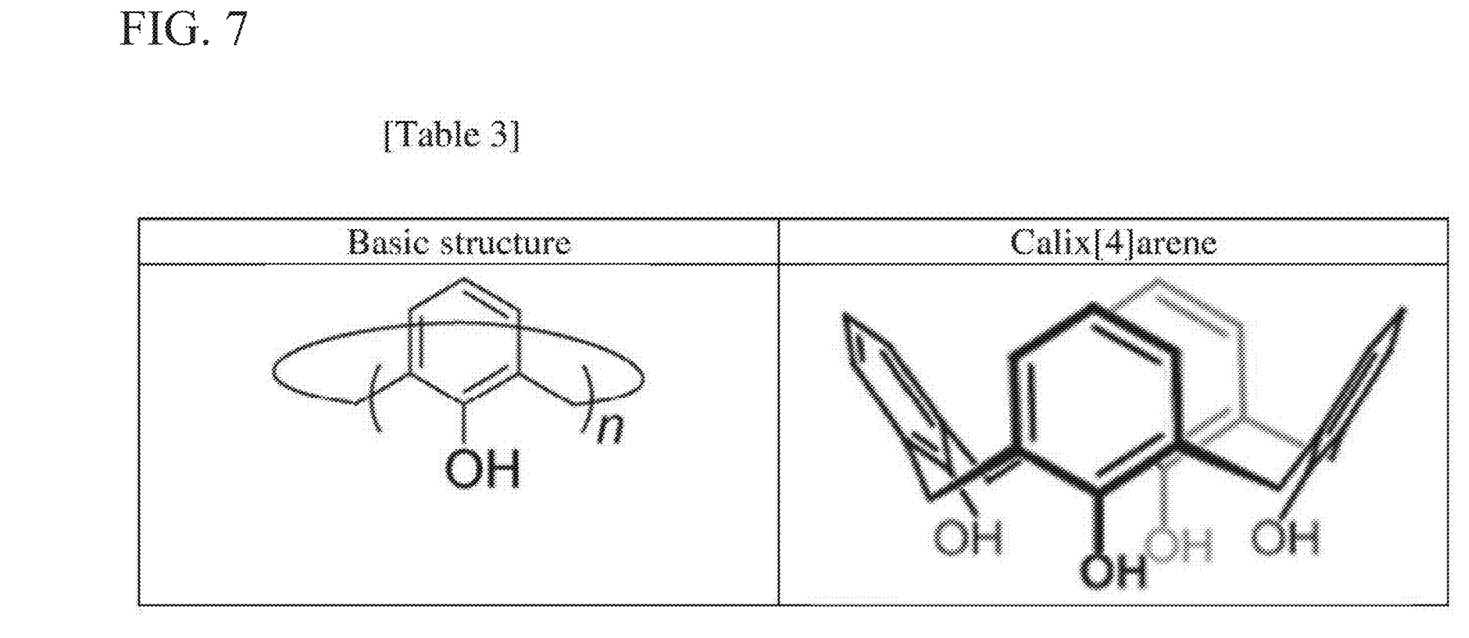
FIG. 7 shows example calixarene structures.

The calixarene may have a structure in FIG. 7 (Table 3 therein).

In FIG. 7, the calixarene may have a structure in which 4-8 phenyl groups, which are repeating units, are bonded (that is, n=4-8). For example, if n is 4, the compound may be named as calix[4]arene. The calixarene may have a hollow three-dimensional structure.

Figure 8:
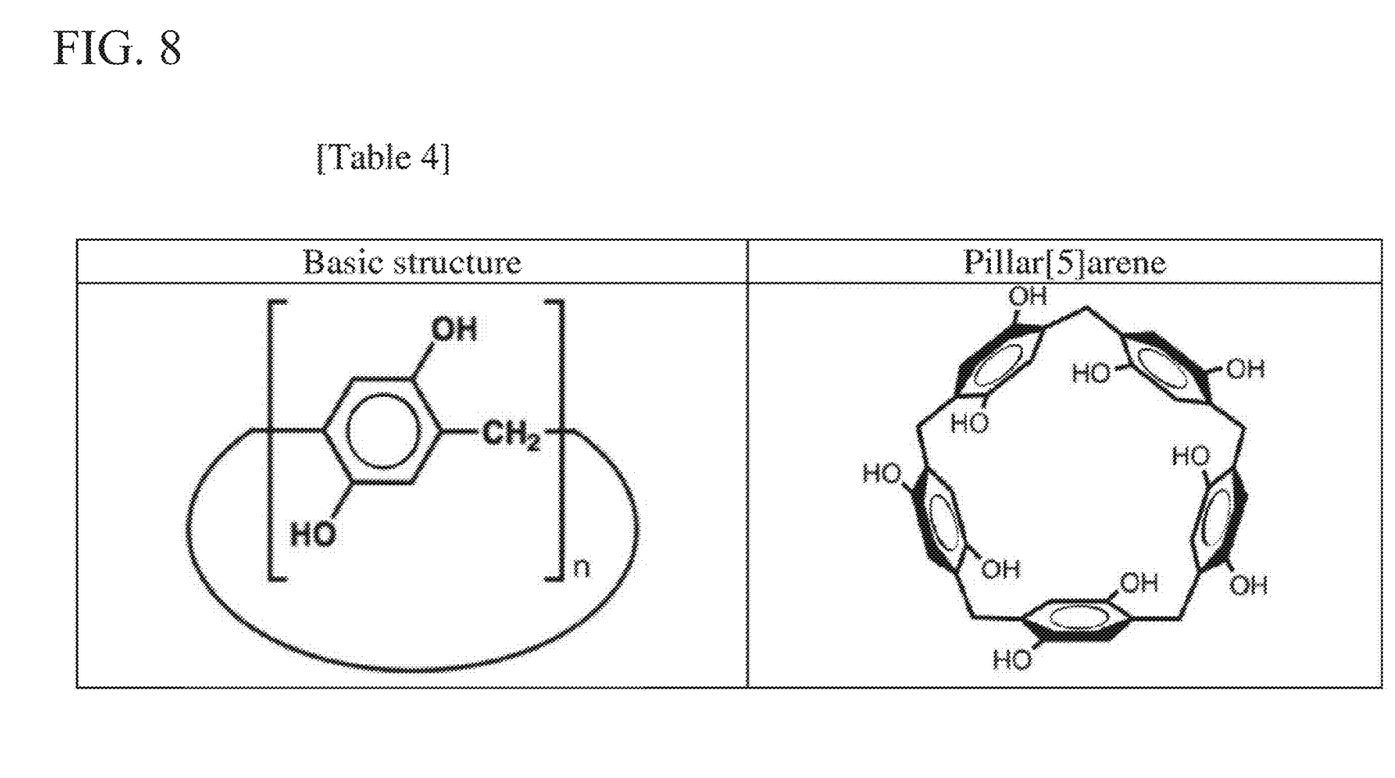
FIG. 8 shows example pillararene structures.

The pillararene may have a structure in FIG. 8 (Table 4 therein).

In FIG. 8, the pillararene may include a hydroquinone group as a repeating unit and may have a structure in which 5-10 repeating units are bonded (that is, n=5-10). For example, if n is 5, the compound may be named as pilla[5] arene. The pillararene may have a hollow three-dimensional structure.

Figure 9:
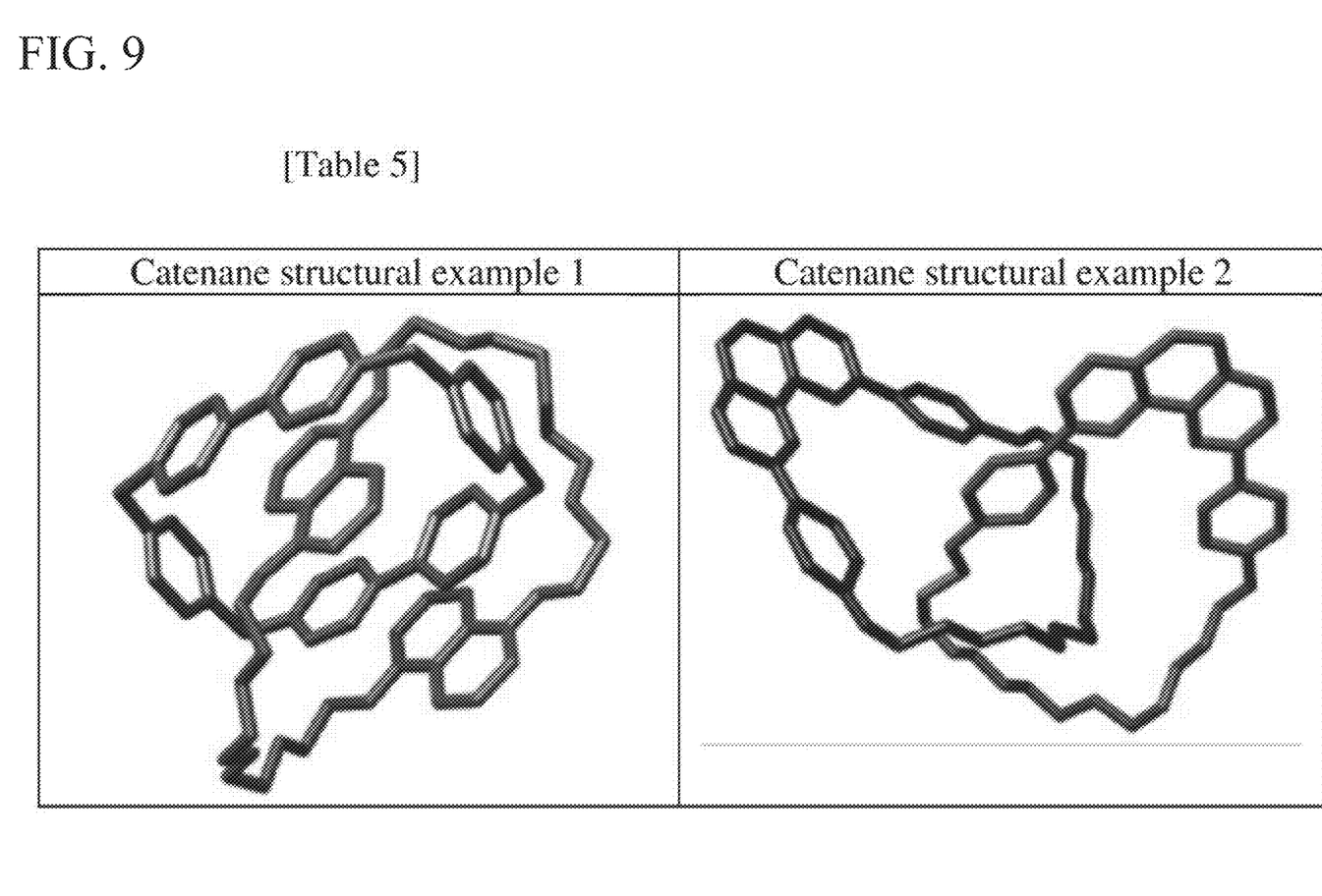
FIG. 9 shows example catenane structures.

The catenane may have a molecular structure in which two or more macrocyclic molecules are mechanically combined. The catenane may have, for example, a structure in FIG. 9 (Table 5 therein).

As described above, all macrocyclic molecules shown in FIG. 5 to FIG. 9 may have a hollow structure.

Some of terminals of the cyclodextrin (CD), the cucurbituril (CB), the calixarene, the pillararene, and the catenane may be substituted with other functional group or molecule.

The fluorescent substance 5b may be, for example, a cyanine (Cy)-based or rhodamine-based fluorescent substance. The cyanine-based fluorescent substance may be, for example, Cy2, Cy3, Cy3B, Cy3.5, Cy5, Cy5.5, or Cy7. The rhodamine-based fluorescent substance may be, for example, Rhodamine B, Rhodamine 6G, or Rhodamine 123.

Particular examples of the material 5 for detecting photoresist may be cyanine-labeled beta-cyclodextrin (cyanine-labeled β-CD) or rhodamine-labeled beta-cyclodextrin (rhodamine-labeled β-CD).

Figure 2:
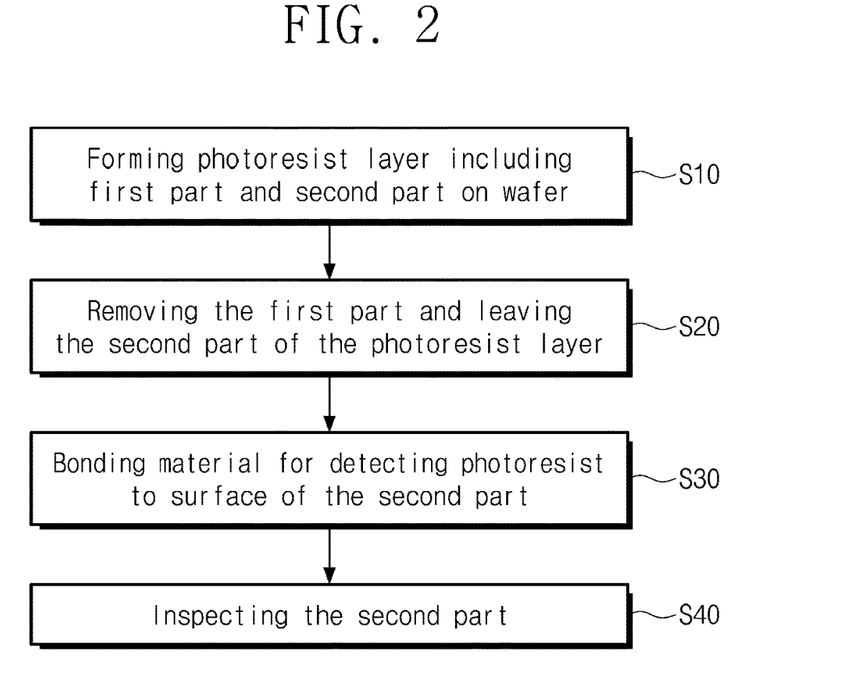
FIG. 2 is a flowchart showing a manufacturing method of a semiconductor device, by which photoresist is detected according to example embodiments.

FIG. 2 is a flowchart showing a manufacturing method of a semiconductor device, by which photoresist is detected according to example embodiments. FIGS. 3A to 3D are cross-sectional views showing a manufacturing method of a semiconductor device, by which photoresist is detected according to example embodiments. FIG. 4 is an enlarged diagram on the "P1" part of FIG. 3C.

Figure 3A:
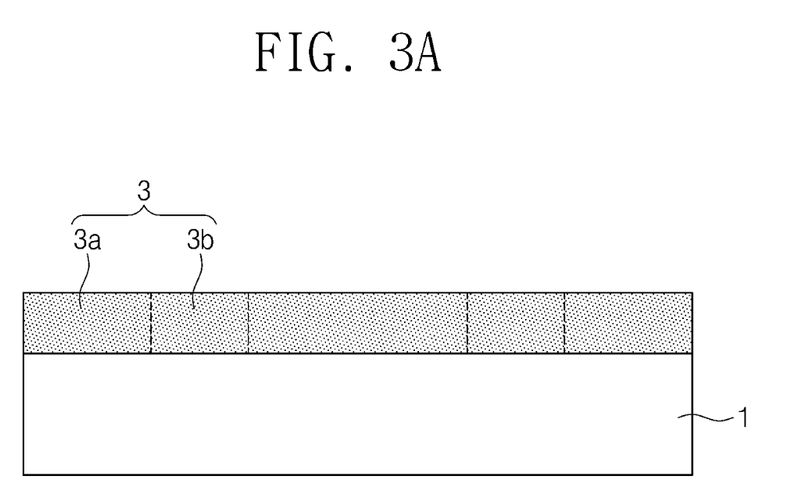
FIGS. 3A to 3D are cross-sectional views showing a manufacturing method of a semiconductor device, by which photoresist is detected according to example embodiments.
Figure 4:
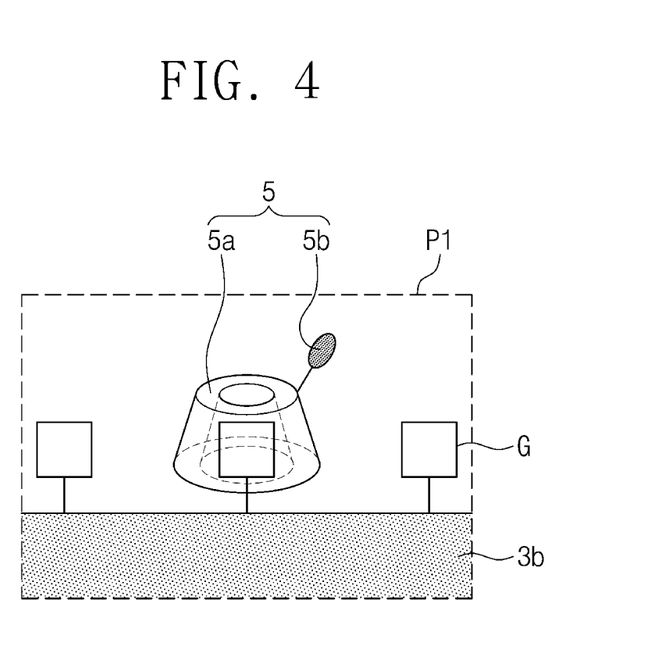
FIG. 4 is an enlarged diagram on the "P1" part of FIG. 3C.

Referring to FIG. 2, FIG. 3A and FIG. 4, in the method for detecting photoresist according to an embodiment, first, a photoresist layer 3 including a first part 3a and a second part 3b is formed on a wafer 1 (S10). Although not shown, an insulating layer or a conductive layer to be etched may be formed on the wafer 1 prior to forming the photoresist layer 3. The photoresist layer 3 may be formed, for example, by coating and baking processes. For example, the photoresist layer 3 may be a polyhydroxystyrene type or a polyacrylate type. The photoresist layer 3 may include a target molecule G which is bonded to a portion of the polyacrylate. The target molecule G may be, for example, at least one of adamantane, a cyclic carbon compound, a cycloalkyl group, a saturated hydrocarbon and an aromatic hydrocarbon. The target molecule G may have a structure shown in Table 6.

TABLE 6

Target molecule 1

Target molecule 2

TABLE 6-continued

Target molecule 3

Target molecule 4

Target molecule 5

Figure 3B:
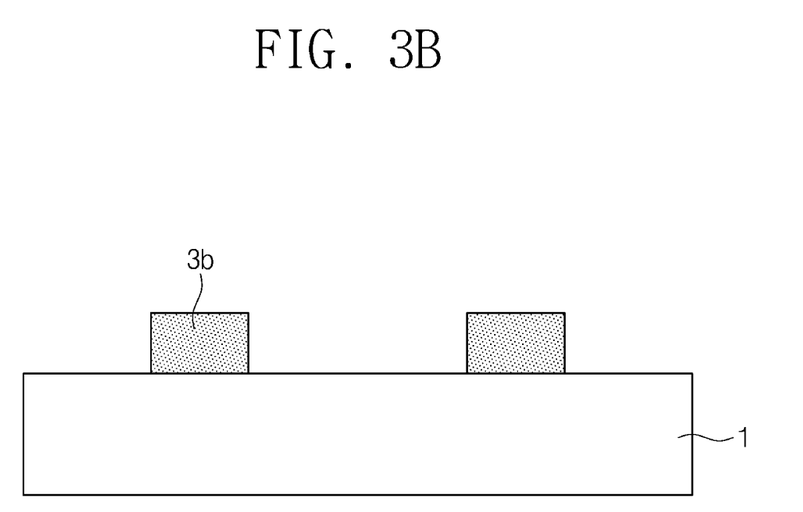

Referring to FIG. 2, FIG. 3A and FIG. 3B, the first part 3a of the photoresist layer 3 may be removed and the second part 3b thereof may be left (S20). The second part 3b may be a photoresist pattern or photoresist residue.

If the second part 3b is the photoresist, the second part 3b may be formed by an exposure process and a developing process. In this case, the subsequent inspection of the second part 3b may be conducted for inspecting whether a photoresist pattern is formed in a desired shape after the exposure and developing processes. The first part 3a or the second part 3b may be an exposed part by the exposure process. The first part 3a may be removed by the developing process. The photoresist layer 3 may be hydrophobic before performing the exposure process. By the exposure process, the exposed part may be changed into a hydrophilic part. If the first part 3a is an exposed part, this part may be changed into a hydrophilic part. In this case, for example, tetramethylammonium hydroxide (TMAH) may be used to remove the first part 3a. If the second part 3b is an exposed part, the second part 3b may be changed into a hydrophilic part, and the first part 3a may maintain the hydrophobic state. In this case, for example, N-butyl acetate (NGA) may be used to remove the first part 3a.

If the second part 3b is the photoresist residue, the first part 3a may be removed by a strip process (or a cleaning step). The strip process may be performed using tetramethylammonium hydroxide (TMAH). In this case, the subsequent inspection of the second part 3b may be performed for checking the performance of the photoresist.

Figure 3C:
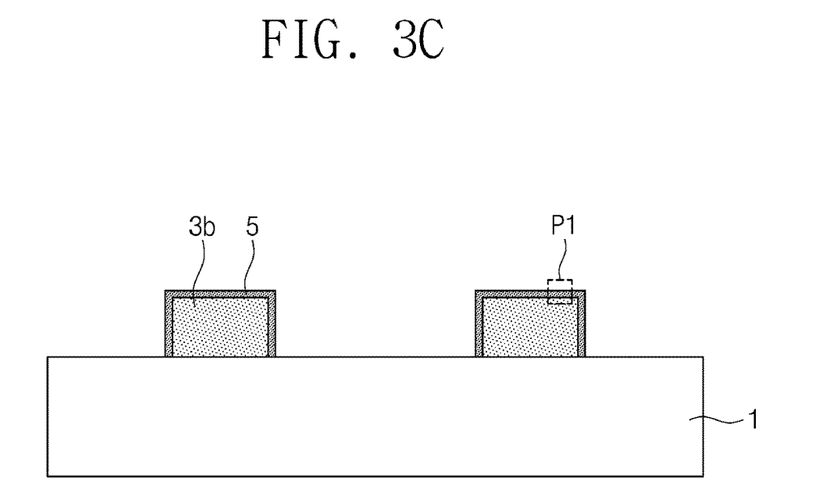

Referring to FIG. 2, FIG. 3C and FIG. 4, the material 5 for detecting photoresist may be bonded to the surface of the second part 3b (S30). The material 5 for detecting photoresist may be identical or similar to that explained referring to FIG. 1. The target molecule G may be inserted into the hollow structure of the macrocyclic molecule 5a. The step of bonding the material 5 for detecting photoresist to the surface of the second part 3b may include supplying the material 5 for detecting photoresist by a coating, dipping or spraying method. In addition, the step of bonding the material 5 for detecting photoresist with the surface of the second part 3b may further include a step of performing a cleaning step after supplying the material 5 for detecting photoresist to remove the material 5 for detecting photoresist which is not bonded to the second part 3b. In this case, the cleaning step may be performed using water. In a particular embodiment, a solution including the material 5 for detecting photoresist may be prepared. After bonding the material 5 for detecting photoresist to the surface of the second part 3b by coating or spraying the solution on the wafer 1 in the state of FIG. 3B, or dipping the wafer 1 into the solution, a cleaning process may be performed.

The binding affinity ($K_a$) between the target molecule G and the macrocyclic molecule 5a of the material 5 for detecting photoresist may be about $10^4$-$10^5$ $M^{-1}$. Particularly, if the target molecule G is an aromatic hydrocarbon, the binding affinity ($K_a$) may be about $10^5$ $M^{-1}$, and a stable composite is found to be formed.

When beta-cyclodextrin is used as the macrocyclic molecule 5a and target molecules 1-4 of Table 6 are used as the target molecule G, the binding affinity may be shown as in Table 7.

TABLE 7

| | Target molecule 1 | Target molecule 2 | Target molecule 3 | Target molecule 4 |
|---|---|---|---|---|
| Log $K_a$ (at PH 7) | 4.49 | 5.64 | 6.43 | 5.61 |

Referring to Table 7, it could be found that stable bonding was attained overall.

Figure 3D:
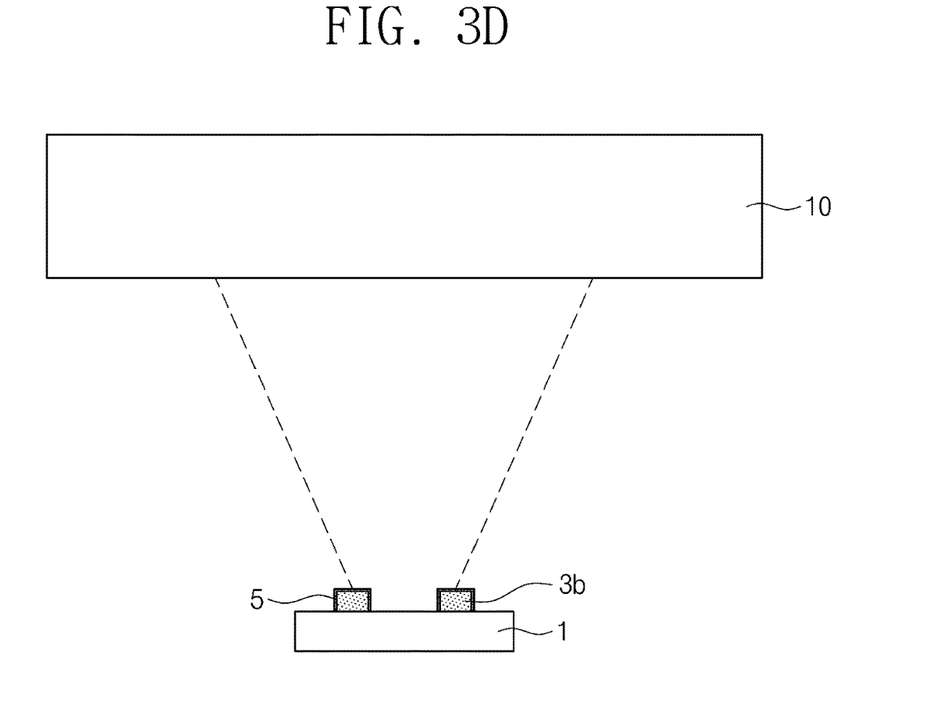

Referring to FIG. 2 and FIG. 3D, the second part 3b is inspected (S40). The inspection of the second part 3b is performed by measuring fluorescence. The measurement of fluorescence may be conducted by using, for example, an inspection apparatus 10 such as a confocal microscopy.

As described above, by bonding a material for detecting photoresist including a fluorescent substance-labeled macrocyclic molecule to the surface of the photoresist and by measuring fluorescence, the residues of photoresist after cleaning process may be inspected. Even though the photoresist residue are minute and several nanometer sizes, detection may be possible. Accordingly, photoresist with excellent performance may be prepared. Alternatively, the photoresist pattern may be inspected after exposure and developing processes if a desired shape is formed well. If the photoresist pattern is formed into a desired shape, underlying insulating layer or conductive layer may be etched using the photoresist pattern as an etching mask. Thus, a semiconductor device having improved reliability may be manufactured.

The material for detecting photoresist according to example embodiments includes a macrocyclic molecule which is marked with a fluorescent substance, and into the hollow structure of the macrocyclic molecule, a target molecule on the surface of the photoresist may be inserted. Thus, the material for detecting photoresist may be bonded to the photoresist, and the photoresist may be detected by measuring fluorescence. Accordingly, the leaving of the residues of the photoresist after a cleaning process may be inspected. Accordingly, photoresist with excellent performance may be prepared. Alternatively, the shape of a photoresist pattern may be inspected after exposure and developing processes if well formed, and thus, a semiconductor device having improved reliability may be manufactured.

Although the example embodiments have been described, it is understood that the present invention should not be limited to these example embodiments but various changes and modifications can be made by one ordinary skilled in the art within the spirit and scope of the disclosure as hereinafter claimed.

What is claimed is:

1. A method of fabricating a semiconductor device, the method comprising:
   a forming step of forming a photoresist layer comprising a first part and a second part on a wafer,
   a removing step of removing the first part and leaving the second part of the photoresist layer,
   a bonding step of bonding a material for detecting photoresist on a surface of the second part, and
   an inspecting step of inspecting the second part to detect the photoresist,
   wherein the material for detecting photoresist comprises a macrocyclic molecule having a hollow structure and a fluorescent substance which is labeled on the macrocyclic molecule,
   wherein the macrocyclic molecule is at least one selected from the group consisting of cyclodextrin, cucurbituril, calixarene, pillararene, and catenane,
   wherein the second part is (a) a photoresist pattern obtained by the removing step or (b) a photoresist residue that was intended to have been removed by the removing step, and
   wherein the inspecting step comprises (a1) detecting a shape of the photoresist pattern or (b1) detecting the photoresist residue.

2. The method of fabricating a semiconductor device of claim 1, wherein the bonding step comprises a supplying step of supplying the material for detecting photoresist by a coating, dipping, or spraying process.

3. The method of fabricating a semiconductor device of claim 2, further comprising a cleaning step of removing the material for detecting photoresist which is not bonded to the second part, after the supplying step.

4. The method of fabricating a semiconductor device of claim 3, wherein the cleaning step is performed using water.

5. The method of fabricating a semiconductor device of claim 1, wherein the second part comprises a target molecule which is bonded to the surface of the second part, and
   wherein in the bonding step, the target molecule is inserted into the hollow structure of the macrocyclic molecule.

6. The method of fabricating a semiconductor device of claim 5, wherein the target molecule comprises at least one of adamantane, a cyclic carbon compound, a cycloalkyl group, a saturated hydrocarbon and an aromatic hydrocarbon.

7. The method of fabricating a semiconductor device of claim 5, wherein the target molecule comprises at least one of -continued 8. The method of fabricating a semiconductor device of claim 1, wherein
the cyclodextrin comprises 6-8 glucose molecules,
the cucurbituril comprises 5-12 glycoluril molecules,
the calixarene comprises 4-8 phenol groups, and
the pillararene comprises 5-10 hydroquinone groups.

9. The method of fabricating a semiconductor device of claim 1, wherein the fluorescent substance is a cyanine-based fluorescent substance or a rhodamine-based fluorescent substance.

10. The method of fabricating a semiconductor device of claim 1, wherein the second part is the photoresist residue.

11. The method of fabricating a semiconductor device of claim 1, wherein the removing of the first part is performed using tetramethylammonium hydroxide (TMAH) or N-butyl acetate (NBA).

12. The method of fabricating a semiconductor device of claim 1, wherein the inspecting step comprises measuring fluorescence.

13. The method of fabricating a semiconductor device of claim 1, wherein the macrocyclic molecule is at least one of cyclodextrin, cucurbituril, pillararene and catenane.

* * * * *